United States Patent
Sakamoto et al.

(10) Patent No.: US 9,431,128 B2
(45) Date of Patent: Aug. 30, 2016

(54) SEMICONDUCTOR DEVICE INCLUDING FUSE CIRCUIT

(71) Applicant: Micron Technology, Inc., Boise, ID (US)

(72) Inventors: Yusuke Sakamoto, Tokyo (JP); Kenji Yoshida, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/635,894

(22) Filed: Mar. 2, 2015

(65) Prior Publication Data

US 2015/0255169 A1    Sep. 10, 2015

(30) Foreign Application Priority Data

Mar. 4, 2014  (JP) .............................. 2014-041562

(51) Int. Cl.
| | |
|---|---|
| *G11C 17/16* | (2006.01) |
| *H03K 19/177* | (2006.01) |
| *G11C 17/18* | (2006.01) |
| *G11C 29/00* | (2006.01) |

(52) U.S. Cl.
CPC .............. *G11C 17/16* (2013.01); *G11C 17/18* (2013.01); *G11C 29/789* (2013.01); *H03K 19/17768* (2013.01)

(58) Field of Classification Search
CPC ... G11C 17/027; G11C 17/16; G11C 17/787; G11C 29/789; G11C 2229/763
See application file for complete search history.

(56) References Cited

U.S. PATENT DOCUMENTS

| | | | | |
|---|---|---|---|---|
| 5,838,625 A | * | 11/1998 | Cutter .................... | G11C 17/18 365/200 |
| 6,246,623 B1 | * | 6/2001 | Ingalls ................. | G11C 29/785 327/525 |
| 6,323,720 B1 | * | 11/2001 | Kim ....................... | G05F 1/465 327/525 |
| 6,741,117 B2 | * | 5/2004 | Lee ........................ | G11C 17/18 327/525 |

FOREIGN PATENT DOCUMENTS

JP    2007-080302    3/2007

* cited by examiner

*Primary Examiner* — Jeffrey Zweizig
(74) *Attorney, Agent, or Firm* — Dorsey & Whitney LLP

(57) ABSTRACT

Disclosed herein is an apparatus that includes a fuse circuit including a fuse element, the fuse circuit configured to provide a first output signal having a first voltage or a second voltage responsive to a state of the fuse element, and a sense circuit configured to provide a second output signal having the first voltage or a third voltage responsive to the first output signal, the third voltage different from the second voltage.

17 Claims, 16 Drawing Sheets

SEMICONDUCTOR DEVICE INCLUDING FUSE CIRCUIT

RELATED REFERENCE

This application is based upon and claims the benefit of priority from Japanese Patent Application No. 2014-041562 filed on Mar. 4, 2014, the disclosure of which are incorporated herein in its entirely by reference.

BACKGROUND OF THE INVENTION

1. Field of the Invention

The present invention relates to a semiconductor device, and particularly relates to a semiconductor device having an antifuse element.

2. Description of Related Art

In a semiconductor device, such as DRAM (Dynamic Random Access Memory), a faulty memory cell is replaced with a redundant memory cell to redress damage caused by the faulty cell. The address of the faulty memory cell is programmed into a nonvolatile memory element, such as antifuse element, during the manufacturing stage.

Examples of nonvolatile memory elements include, for example, a fuse circuit, a fuse element, and an antifuse element. The antifuse element in its initial state has both ends insulated from each other, and applying a high voltage across both ends breaks this insulation, thereby puts the antifuse element in a conductive state. Once the insulation between its both ends is broken, the antifuse element in its conductive state cannot returned to its insulated state. Hence irreversible and nonvolatile information storage is achieved.

SUMMARY

In one embodiment of the disclosure, there is provided an apparatus that includes: a fuse circuit including a fuse element, the fuse circuit configured to provide a first output signal having a first voltage or a second voltage responsive to a state of the fuse element; and a sense circuit configured to provide a second output signal having the first voltage or a third voltage responsive to the first output signal, the third voltage different from the second voltage.

In another embodiment of the disclosure, there is provided an apparatus that includes: a pumping circuit configured to be supplied with a first voltage and a second voltage and perform a pumping operation based on the first voltage and the second voltage to generate a third voltage at an output node; a sense circuit; and an electrical fuse including a first node coupled to the output node of the pumping circuit and a second node coupled to the sense circuit; wherein the pumping circuit is further configured to supply the third voltage to the first node of the electrical fuse when the sense circuit amplifies a voltage at the first node of the electrical fuse.

In another embodiment of the disclosure, there is provided an apparatus that includes: a fuse circuit including a fuse element; a sense circuit; and a first transistor coupled between a first node of the fuse circuit and an input node of the sense circuit, the first transistor having a gate supplied with a constant voltage.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be realized using the teachings of the present invention and that the invention is not limited to the embodiments illustrated for explanatory purposes.

A first embodiment of the present invention will be described below in detail with reference to the accompanying drawings.

Figure 1:
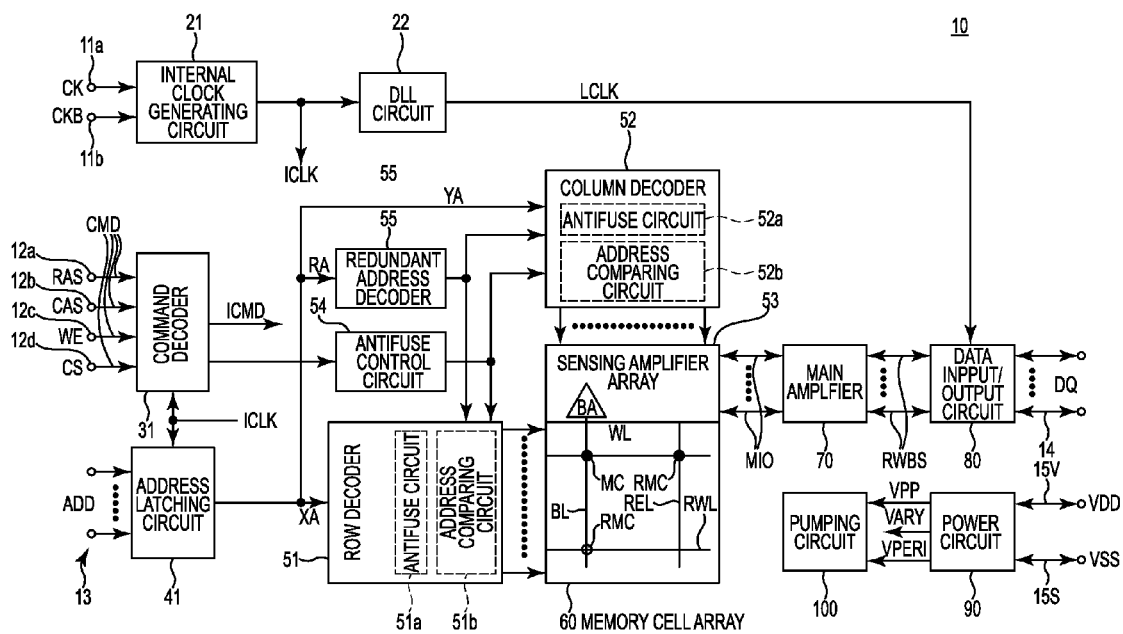
FIG. 1 is a block diagram of a configuration of a semiconductor device according to embodiments.

FIG. 1 is a block diagram of a configuration of a semiconductor device 10 according to preferred first to third embodiments of the present invention.

The semiconductor device 10 is a DDR4 (Double Data Rate 4) synchronous DRAM, and at least includes such external terminals as clock terminals 11a and 11b, command terminals 12a to 12d, address terminals 13, data input/output terminals 14, and power terminals 15v and 15s.

The clock terminals 11a and 11b are supplied with complementary external clock signals CK and CKB, respectively. The external clock signals CK and CKB are supplied to an internal clock generating circuit 21. The internal clock generating circuit 21 generates an internal clock signal ICLK and supplies it to a DLL circuit 22 and to various internal circuits. Receiving the internal clock signal ICLK, the DLL circuit 22 generates an internal clock signal LCLK for output and supplies it to a data input/output circuit 80.

The command terminals 12a to 12d are supplied with such command signals CMD as a low address strobe signal RAS, column address strobe signal CAS, write enable signal WE, and chip select signal CS. These command signals CMD are supplied to a command decoder 31. In synchronization with the internal clock signal ICLK, the command decoder 31 saves, decodes, and counts the command signals, and thereby generates various internal commands ICMD.

The address terminal 13 is supplied with address signals ADD composed of multiple bits. The address signals ADD are supplied to an address latching circuit 41, which latches the incoming address signals ADD in synchronization with the internal clock signal ICLK. Among the address signals ADD latched by the address latching circuit 41, an address signal ADD representing a row address XA is supplied to a row decoder 51 and an address signal ADD representing a column address YA is supplied to a column decoder 52. When programming of an antifuse element is carried out, a redundant address RA is supplied to a redundant address decoder 55.

Based on the row address XA, the row decoder 51 selects any one of word lines WL included in a memory cell array 60.

The row decoder 51 includes an antifuse circuit 51a and an address comparing circuit 51b. The antifuse circuit 51a may not be included in the row decoder 51 but may be included in a different area of the semiconductor chip.

The antifuse circuit 51a is a nonvolatile memory element that stores information in a nonvolatile manner. The antifuse circuit 51a is provided as, for example, a fuse circuit, a fuse element, or an antifuse element. The antifuse circuit 51a, in particular, stores information of a faulty address, etc. When a row address XA corresponding to a faulty word line WL is input to the row decoder 51, a redundant word line RWL is selected as a replacement for the faulty word line WL. This allows a redundant memory cell RMC to be accessed instead of a faulty memory cell MC.

The row address XA of the faulty word line WL is stored in the antifuse circuit 51a, and a row address XA to which access is requested and the row address XA stored in the antifuse circuit 51a are compared with each other by the address comparing circuit 51b. The operation of the antifuse circuit 51a is controlled by an antifuse control circuit 54 and a redundant address decoder 55.

The memory cell array 60 has word lines WL and bit lines BL intersecting with each other, and memory cells MC arranged at the interactions between the word lines WL and the bit lines BL. The bit lines BL are connected to the corresponding sensing amplifiers SA in a sensing amplifier array 53.

The column decoder 52 selects a bit line BL, based on a column address YA.

The column decoder 52 includes an antifuse circuit 52a and an address comparing circuit 52a. The antifuse circuit 52a may not be included in the column decoder 52 but may be included in a different area of the semiconductor chip. The antifuse circuits 51 a and 52a may be composed of an array of multiple antifuses.

The antifuse circuit 52a is a nonvolatile memory element that stores information in a nonvolatile manner. The antifuse circuit 52a is provided as, for example, a fuse circuit, a fuse element, or an antifuse element. The antifuse circuit 52a, in particular, stores information of a faulty address, etc. When a column address YA corresponding to a faulty bit line BL is input to the column decoder 52, a redundant bit line RBL is selected as a replacement for the faulty bit line BL. This allows a redundant memory cell RMC to be access instead of a faulty memory cell MC.

The column address YA of the faulty bit line BL is stored in the antifuse circuit 52a, and a column address YA to which access is requested and the column address YA stored in the antifuse circuit 52a are compared with each other by the address comparing circuit 52b. The operation of the antifuse circuit 52a is controlled by the antifuse control circuit 54 and the redundant address decoder 55.

A bit line BL or redundant bit line RBL selected by the column decoder 52 is connected to a main amplifier 70 via the sensing amplifier SA and a main I/O interconnect MIO. When carrying out a reading operation, the main amplifier 70 amplifies read data read from a memory cell via the main I/O interconnect MIO and supplies the amplified read data to a read/write bus RWBS. When carrying out a writing operation, the main amplifier 70 supplies incoming write data from the read/write bus RWBS, to the main I/O interconnect MIO.

The read/write bus RWBS is connected to a data input/output circuit 80. The data input/output circuit 80 reads incoming data from the read/write bus RWBS as parallel data DQ and outputs the read data DQ in the form of serial data from the data input/output terminal 14. The data input/output circuit 80 receives incoming serial write data DQ from the data input/output terminal 14 and supplies the write data DQ in the form of parallel data to the read/write bus RWBS.

The power terminal 15v and the power terminal 15s are supplied with a source voltage VDD and a ground voltage VSS, respectively. These power terminals 15v and 15s are connected to a power circuit 90, which generates various internal voltages based on the source voltage VDD and the ground voltage VSS.

The internal voltages generated by the power circuit 90 include internal voltages VPP, VARY, and VPERI. The internal voltage VPP is generated by raising the source voltage VDD and is used mainly by the row decoder 51. The internal voltage VARY is generated by reducing the source voltage VDD and is used mainly by the sensing amplifier array 53. The internal voltage VPERI is generated by reducing the source voltage VDD and is used as a source voltage by most of circuit blocks.

The internal voltage VPP is supplied also to a pumping circuit 100, which is the circuit that generates various voltages used for a connecting operation and a loading operation on fuse circuits 51a and 52a. A "connecting operation" is a programming operation of applying a high voltage across both ends of an antifuse element to breakdown the insulation between both ends. Whether the insulation of the antifuse element has a breakdown is determined by a "loading operation".

<First Embodiment>

Figure 2:
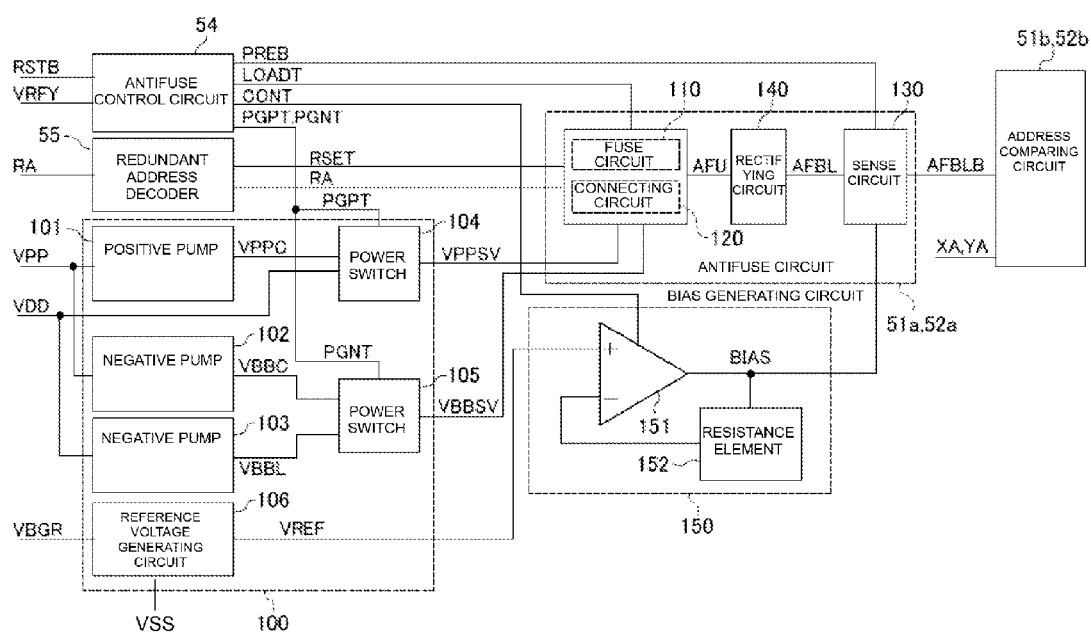
FIG. 2 is a block diagram for explaining a configuration of antifuse circuits and a pump circuit according to a first embodiment.

FIG. 2 is a block diagram for explaining a configuration of the antifuse circuits 51a and 52a and the pump circuit 100 according to the first embodiment.

As shown in FIG. 2, each of the antifuse circuits 51 a and 52a has a fuse circuit 110, a connecting circuit 120, a sense circuit 130, and a rectifying circuit 140.

The fuse circuit 110 is a circuit block including an antifuse element, and is used when the connecting operation and the loading operation are carried out. The connecting circuit 120 is used when the connecting operation is carried out, while the sense circuit 130 is used when the loading operation is carried out.

The rectifying circuit 140 is connected between the sense circuit 130 and the fuse circuit 110 and connecting circuit 120, and rectifies current flowing through the antifuse element. The rectifying circuit 140 is used to prevent current backflow upon execution of the loading operation.

The loading operation is controlled by a pre-charge signal PREB and a load signal LOADT supplied from the antifuse control circuit 54. The antifuse control circuit 54 is controlled by a reset signal RSTB activated upon initialization of the semiconductor device 10 and a verify signal VRFY activated upon execution of a verifying operation included in the connecting operation.

The connecting operation is controlled by a select signal RSET and a redundant address RA that are supplied from the redundant address decoder 55. Upon execution of the connecting operation, the redundant address decoder 55 is supplied with the redundant address RA (the address of a faulty word line WL or faulty bit line BL), decodes the redundant address RA, and thereby supplies the redundant address RA to the antifuse circuits 51a and 52a that are subjected to the connecting operation.

Upon execution of the loading operation, the sense circuit 130 senses information read from the antifuse element, latches the sensed information, and thereby generates faulty address information AFBLB, which is a judgment signal. The faulty address information AFBLB is supplied to the address comparing circuits 51b and 52b. The address comparing circuits 51b and 52b compares the faulty address information AFBLB with the row address XA or column address YA. When the faulty address information AFBLB and the row address XA or column address YA do not match (mishit), the address comparing circuits 51b and 52b select the word line WL or bit line BL based on the row address XA or column address YA. When the faulty address information AFBLB and the row address XA or column address YA match (hit), the address comparing circuits 51b and 52b select the redundant word line RWL or redundant bit line RBL.

The pumping circuit 100 has a positive pump 101, negative pumps 102 and 103, power switches 104 and 105, and a reference voltage generating circuit 106.

The positive pump 101 is a circuit that generates a high voltage VPPC by a pumping operation using the internal voltage VPP. The high voltage VPPC is, for example, 5.0 V. The high voltage VPPC generated by the positive pump 101 is supplied to the power switch 104. Based on a program signal PGPT, the power switch 104 supplies either the high voltage VPPC or the source voltage VDD to a power interconnect VPPSV, which is connected to the connecting circuit 120.

The negative pumps 102 and 103 are circuits that generate negative voltages VBBC and VBBL, respectively, by a pumping operation using the internal voltage VPP. The negative voltages VBBC and VBBL represent the same potential of, for example, −1.0 V. The negative voltages VBBC and VBBL generated by the negative pumps 102 and 103 are supplied to the power switch 105. Based on a program signal PGNT, the power switch 105 supplies one of the negative voltages VBBC and VBBL to a power interconnect VBBSV, which is connected to the fuse circuit 110. For example, in a configuration in which one antifuse element AF serves as one bit memory, the power interconnect VBBSV is connected as a common interconnect, to multiple antifuse elements AF.

The reference voltage generating circuit 106 generates a reference voltage VREF, based on a band gap reference voltage VBGR, which is a constant voltage independent of process variance, temperature changes, and voltage changes. The reference voltage VREF is supplied to a non-inverting input node (+) of a differential amplifier 151 included in a bias generating circuit 150. The output from the output node of the differential amplifier 151 is fed back to an inverting input node (−) via a resistance element 152. A bias voltage BIAS output from the output node of the differential amplifier 151 is supplied to the sense circuit 130.

Figure 3:
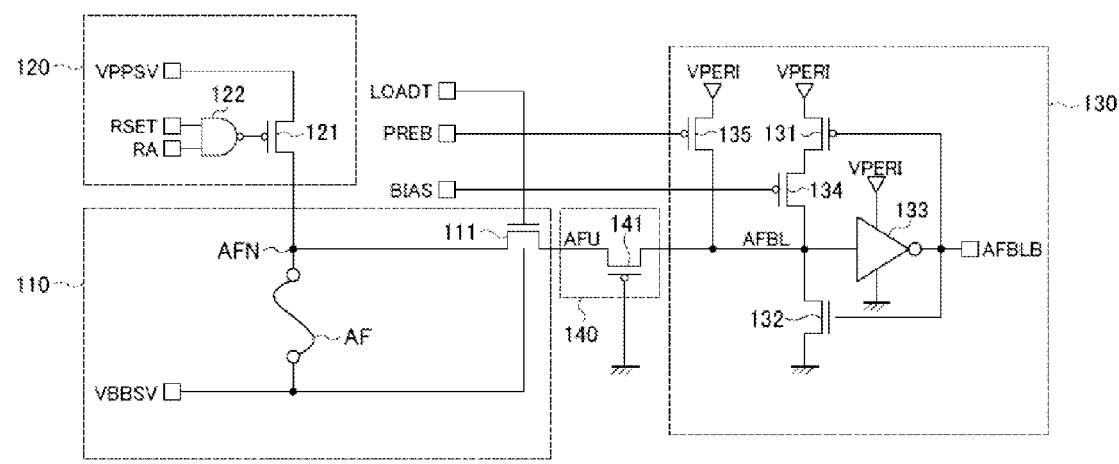
FIG. 3 is a circuit diagram of a loading circuit, a connecting circuit, a sensing circuit, and a rectifying circuit according to the first embodiment.

FIG. 3 is a circuit diagram of the fuse circuit 110, the connecting circuit 120, the sense circuit 130, and the rectifying circuit 140 according to the first embodiment.

As shown in FIG. 3, the fuse circuit 110 has the antifuse element AF connected between a connection node AFN and the power interconnect VBBSV, and an N-channel-type MOS transistor 111 connected between the connection node AFN and a connection node AFU. The sense circuit 130 includes a sensing node AFBL.

The rectifying circuit 140 is connected between the MOS transistor 111 included in the fuse circuit 110 and the sensing node AFBL included in the sense circuit 130. The rectifying circuit 140 includes a transistor 141, which is, for example, a PMOS transistor (a P conductivity type transistor) having a source/drain path between the connection node AFU and the node AFBL, and a grounded gate electrode. Depending on an adopted circuit configuration, the transistor 141 may be provided as an NMOS transistor (an N conductivity type transistor) having a source/drain path between the connection node AFU and the node AFBL.

The antifuse element AF in its initial state has its both ends insulated from each other. A high voltage applied across both ends by the connection operation causes the insulation to breakdown between both ends, thus putting the antifuse element AF in a conductive state. The circuit diagram of FIG. 3 depicts the circuit corresponding to one antifuse elements AF. There are as many circuits of FIG. 3 as antifuse elements AF included in the semiconductor device 10. The number of the antifuse elements AF included may be based on (number of redundant addresses that can be stored)×(number of bits of a redundant address). The antifuse element AF may also be needed for an enable bit.

The transistor 111 is a switch that controls connection between the antifuse element AF and the connection node AFU, and has a gate electrode supplied with a load signal LOADT. The substrate of the transistor 111 is connected to the power interconnect VBBSV.

The load signal LOADT is activated to a high-voltage level upon execution of the loading operation. Upon execution of the loading operation, the connection node AFU is connected to the power interconnect VBBSV via the antifuse element AF. The connection node AFU is connected to the sensing node AFBL in the sense circuit 130 via the rectifying circuit 140 composed of the P-channel-type MOS transistor 141. The voltage at the gate electrode of the transistor 141 is fixed to the ground voltage VSS, so that even if the voltage at the connection node AFU becomes negative, the voltage at the sensing node AFBL never becomes negative.

The connecting circuit 120 has a P-channel-type MOS transistor 121 connected between the power interconnect VPPSV and the connection node AFN. The gate electrode of the transistor 121 receives an output signal from a NAND gate circuit 122 that receives the select signal RSET and the corresponding bit of the redundant address RA. The select signal RSET is the signal assigned to each redundant address. When M+1 redundant addresses can be stored, select signals RSET of M+1 bits are used. When the connecting operation corresponding to the given select signal RSET is carried out, the antifuse element AF is connected to the power interconnect VPPSV if the logical level of the corresponding bit of the redundant address RA is high.

The sense circuit 130 has a latching circuit including an inverter circuit composed of a P-channel-type MOS transistor 131 and an N-channel-type MOS transistor 132 connected to an inverter circuit 133 that serves as a judging circuit. The input node of the inverter circuit 133 is connected to the sensing node AFBL. The source of the transistor 131 is supplied with the internal voltage VPERI, while the source of the transistor 132 is supplied with the ground voltage VSS. The internal voltage VPERI is, for example, 1.0 V. As an operating voltage to the inverter circuit 133, a voltage (1.0 V) between the internal voltage VPERI and the ground voltage VSS is used.

A P-channel-type bias transistor 134 is connected between the transistor 131 and the sensing node AFBL. The gate electrode of the bias transistor 134 is supplied with a bias voltage BIAS. A current control circuit composed of the transistors 131 and 134 controls the magnitude of a sense current flowing through the sensing node AFBL, according to the bias voltage BIAS.

A pre-charge transistor 135 is connected between a power interconnect supplied with the internal voltage VPERI and the sensing node AFBL. The gate electrode of the pre-charge transistor 135 receives a pre-charge signal PREB. When the pre-charge signal PREB is activated to a low-voltage level, the sensing node AFBL is pre-charged to the voltage level of the internal voltage VPERI (1.0 V).

Figure 4:
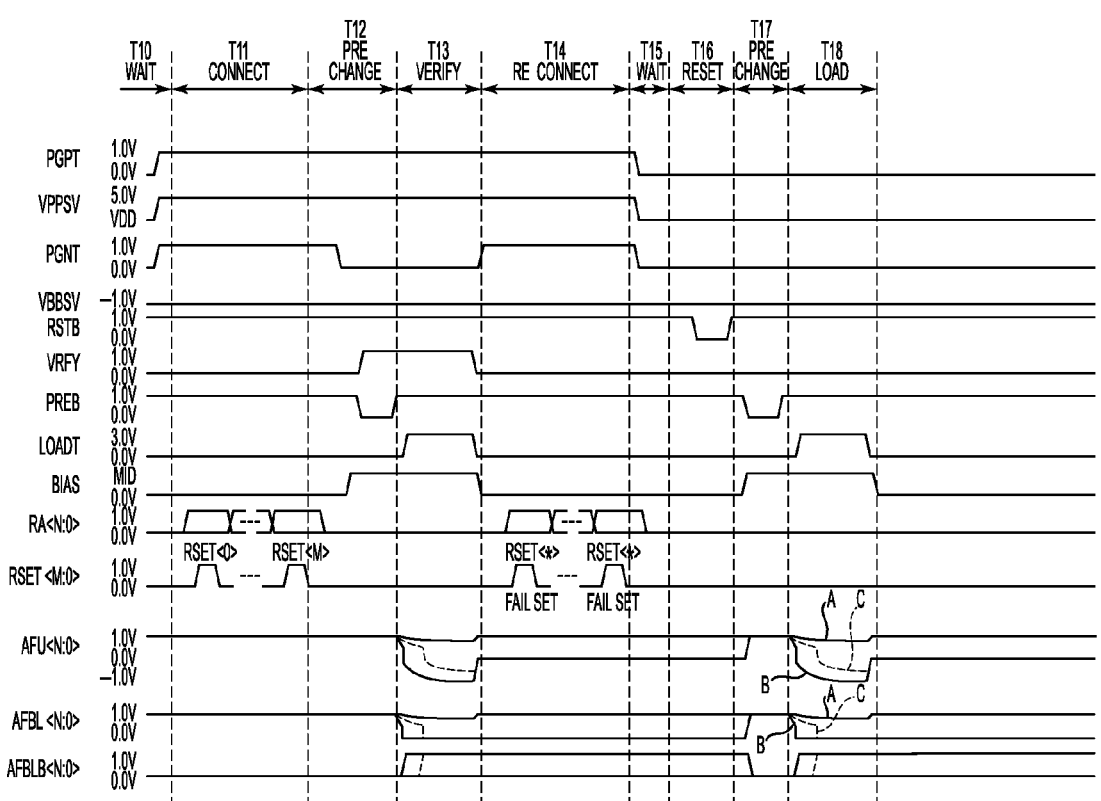
FIG. 4 is a timing chart for explaining an operation according to the first embodiment.

FIG. 4 is a timing chart for explaining an operation according to the first embodiment.

In a stand-by period T10, both of the program signals PGPT and PGNT are at a low-voltage level. As a result, the source voltage VDD is supplied to the power interconnect VPPSV, and the negative voltage VBBL (−1.0 V) is supplied to the power interconnect VBBSV via the negative pump 103.

In a connect period T11, the program signals PGPT and PGNT shift to high-voltage level signals. As a result, the high voltage VPPC (5.0 V) is supplied to the power interconnect VPPSV and the negative voltage VBBC (−1.0 V) is supplied to the power interconnect VBBSV via the negative pump 102. In this state, a series of select signals RSET go high in sequence, and each bit of the redundant address RA corresponds to each high-voltage level select signal RSET is input to the connecting circuit 120. In the example of FIG. 4, select signals RSET are of M+1 bits (RSET<0> to RSET<M>) and redundant addresses RA are of n+1 bits (RA<0> to RA<N>).

As a result, when the corresponding bit of the redundant address RA is high in voltage level, a connect voltage of about 6 V is applied across both ends of the antifuse element AF of FIG. 3, and this voltage application causes an insulating film included in the antifuse element AF to break down. This operation is repeated as select signals RSET to be activated are switched in sequence until all redundant addresses RA are programmed.

In a pre-charge period T12, the program signal PGNT shifts back to a low-voltage signal as a verify signal VRFY and the pre-charge signal PREB are activated to a high-voltage level and a low-voltage level, respectively. As a result, the sensing node AFBL in the sense circuit 130 is pre-charged to the voltage level of the internal voltage VPERI (1.0 V).

In a verify period T13, the pre-charging is canceled and the load signal LOADT is activated to a high-voltage level. As a result, the sensing node AFBL is connected to the power interconnect VBBSV via the rectifying circuit 140 and the antifuse element AF. A sense current determined by the bias voltage BIAS, therefore, flows through the antifuse element AF, and the voltage at the sensing node AFBL changes depending on the magnitude of the sensing current.

When the antifuse element AF is not put in connected state (i.e., kept in its insulated state), sense current hardly flows through the antifuse element AF. The voltage at the connection node AFU, therefore, is kept at the pre-charged voltage level, as indicated by reference numeral A.

When the antifuse element AF is put in connected state (i.e., put in conductive state), the sense current flows through the antifuse element AF. The voltage at the connection node AFU, therefore, drops significantly, as indicated by reference numeral B.

When the antifuse element AF is put in connected state (i.e., put in conductive state), the following two cases result: (1) the resistance of the antifuse element AF is relatively high and (2) the resistance of the antifuse element AF is sufficiently low.

(1) When the resistance of the antifuse element AF is relatively high despite the fact that the antifuse element AF is put in connected state (i.e., put in conductive state), which means that the antifuse element AF is put in semi-connected state, little sense current flows through the antifuse element AF. As a result, the voltage at the connection node AFU drops mildly, as indicated by reference numeral C. When the voltage at the sensing node AFBL drops below a logical threshold voltage for the sense circuit 130, a reverse signal from the inverter circuit 133 is fed back to the sensing node AFBL via the transistor 132, which causes the voltage level of the sensing node AFBL to drop sharply. As a result, information read from the antifuse element AF is latched.

According to this embodiment, in the verify period T13, a voltage applied across both ends of the antifuse element AF is given by VPERI (1.0 V)−VBBL (−1.0 V), which is equal to about 2 V. Comparing this case with the case of determining a voltage applied across both ends of the antifuse element AF to be VPERI−VSS (=1.0 V) reveals that a larger sense current is secured in this case. Even if the antifuse element AF is put in semi-connected state, therefore, the voltage at the sense node AFBL can be dropped significantly, which ensures a proper sensing operation.

(2) When the antifuse element AF is put in connected state and its resistance is sufficiently low, the voltage at the connection node AFU may drop to a voltage close to −1.0 V, as indicated by reference numeral B.

In such a case, the rectifying circuit 140 rectifies the current flowing through the antifuse element. Because the rectifying circuit 140 is interposed between the sense node AFBL and the connection node AFU, the voltage at the sense node AFBL never drops below the ground voltage VSS. Having its gate electrode grounded, the transistor 141 is rendered non-conductive when the voltage at the connection node AFU drops sharply. This prevents the voltage at the connection node AFBL from dropping below the ground voltage. This means that current backflow from an interconnect (source of the transistor 132) supplied with the ground voltage VSS to the power interconnect VBBSV does not occur.

In a case where VBBSV nodes of FIG. 3 are provided for multiple reading circuits 130 and antifuse elements AF corresponding thereto, respectively, current may flow from a VBBSV node connected to an element AF with sufficiently low resistance into a VBBSV node connected to an element AF with relatively high resistance. Due to this inflow current, the potential at the low-voltage side of the element AF with relatively high resistance increases, which results in a failure in creating a sufficient potential difference between both ends of the element AF, thus leading to a reading failure. However, the rectifying circuit 140 (transistor 141) corresponding to the element AF with sufficiently low resistance becomes non-conductive to prevent the current inflow.

In a reconnect period T14, when the presence of an antifuse element AF not in properly connected state is found as a result of the verifying operation, a reconnecting operation is carried out on the antifuse element AF.

In a stand-by period T15, a series of programming is completed.

Following the completion of the programming, information is read from the antifuse element AF every time the semiconductor device 10 is reset.

In a reset period T16, the reset signal RSTB is activated to a low-voltage level.

In a pre-charge period T17, the pre-charge signal PREB is activated to a low-voltage level. As a result, the sense node AFBL in the sense circuit 130 is pre-charged to the voltage level of the internal voltage VPERI (1.0 V).

In a load period T18, the pre-charging is canceled and the load signal LOADT is activated to a high-voltage level. As a result, the sense node AFBL is connected to the power interconnect VBBSV via the rectifying circuit 140 and the antifuse element AF.

The operation carried out in the load period T18 is the same as the operation carried out in the above verify period T13, according to which the voltage at the sense node AFBL changes depending on whether the antifuse element AF is in connected state or not.

According to this embodiment, in the load period T18, the voltage applied across both ends of the antifuse element AF is about 2 V, which ensures a large sense current. Even if the antifuse element AF is in semi-connected state, therefore, the voltage at the sense node AFBL can be dropped sufficiently.

When the antifuse element AF is in connected state and its resistance is sufficiently low, the rectifying circuit 140 prevents current backflow from the interconnect (source of the transistor 132) supplied with the ground voltage VSS to the power interconnect VBBSV.

As described above, according to the first embodiment, information saved by the antifuse element AF can be read with high sensitivity as current backflow is prevented.

<Modification of First Embodiment>

Figure 5:
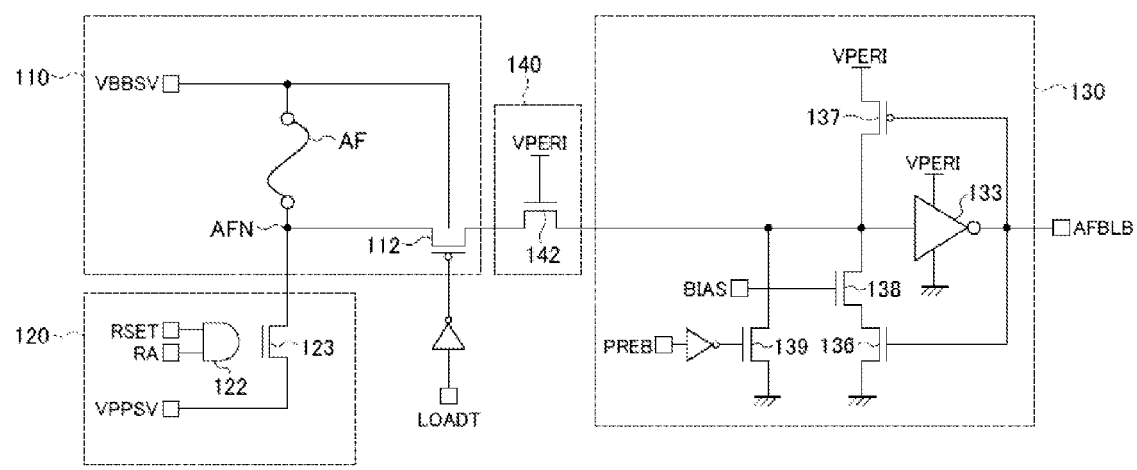
FIG. 5 is a circuit diagram of the loading circuit, the connecting circuit, the sensing circuit, and the rectifying circuit configured as a modification of the first embodiment.

FIG. 5 is a circuit diagram of the fuse circuit 110, the connecting circuit 120, the sense circuit 130, and the rectifying circuit 140 configured as a modification of the first embodiment.

The modification of FIG. 5 is the same as the circuit diagram of FIG. 3 except that in overall configuration, the circuits of FIG. 5 are set reverse in polarity to the circuits of FIG. 3. The N-channel-type MOS transistors 111 and 132 of FIG. 3 are replaced with P-channel-type MOS transistors 112 and 137 of FIG. 5, and P-channel-type MOS transistors 121, 131, 134, 135, and 141 of FIG. 3 are replaced with N-channel-type MOS transistors 123, 136, 138, 139, and 142 of FIG. 5.

The rectifying circuit 140 is connected between the MOS transistor 112 included in the fuse circuit 110 and the input node of the inverter circuit 133 included in the sense circuit 130. The rectifying circuit 140 has an NMOS transistor having a source/drain path between the MOS transistor 112 and the input node of the inverter circuit 133. The voltage at the gate electrode of the transistor 142 is fixed to, for example, the internal voltage VPERI.

When the loading operation is carried out, a voltage (e.g., 2.0 V) higher than the internal voltage VPERI is applied to the power interconnect VBBSV. As a result, even when the antifuse element AF is in connected state and its resistance is sufficiently low, current does not flow from the power interconnect VBBSV back to the source of the transistor 136. In this manner, in the circuit configuration with reverse polarity, the same effect can also be achieved.

As described above, a fuse circuit 110 includes a fuse element AF. The fuse circuit 110 is configured to provide a first output signal AFU having either a voltage VPERI or a voltage VBBSV responsive to a state of the fuse element AF. A sense circuit 130 is configured to provide a second output signal AFBLB having either the voltage VPERI or a voltage VSS responsive to the first output signal AFU.

The voltage VBBSV is greater in absolute value than the voltage VSS. The voltage VPERI is greater in potential than each of the voltages VBBSV, VSS.

The fuse circuit 110 is configured to be supplied with the voltage VPERI during a first period of time and change its voltage to the voltage VBBSV responsive to the state of the fuse element AF during a second period of time following the first period of time. The fuse circuit 110 is configured to change its voltage to the voltage VBBSV during the second period of time on condition that the fuse element AF is programmed. The fuse circuit 110 is configured to maintain its voltage at the voltage VPERI during the second period of time on condition that the fuse element AF is not programmed.

A pumping circuit (a negative pump 103) is configured to be supplied with a voltage VDD and a voltage VSS and perform a pumping operation based on the voltage VDD and the voltage VSS to generate a voltage VBBL at an output node. An electrical fuse (a fuse element AF) includes a first node coupled to the output node of the pumping circuit 103 and a second node coupled to the sense circuit 130. The pumping circuit 103 is configured to supply the voltage VBBL to the first node of the electrical fuse AF when the sense circuit 130 amplifies a voltage at the second node of the electrical fuse AF. The voltage VBBL is a negative voltage. An additional pumping circuit (a positive pump 101) is configured to be supplied with the voltage VDD and the voltage VSS and perform an additional pumping operation based on the voltage VDD and the voltage VSS to generate a voltage VPPC at an additional output node. A connecting circuit 120 is coupled between the additional output node and the second node of the electrical fuse AF. The connecting circuit 120 is configured to supply the voltage VPPC to the second node of the electrical fuse AF when the connecting circuit 120 is enabled. The additional pumping circuit 101 is configured to stop the additional pumping operation when the sense circuit 130 amplifies the voltage at the second node of the electrical fuse AF.

A fuse circuit 110 includes a fuse element AF. A transistor 141 is coupled between a first node of the fuse circuit and an input node of a sense circuit 130. The transistor 141 has a gate supplied with a constant voltage VSS. A transistor 111 is coupled in series to the transistor 141 between the first node of the fuse circuit 110 and the input node of the sense circuit 130. The transistor 111 is configured to turn on during a read mode and turn off during a programming mode. The first node of the fuse circuit 110 is supplied with a first voltage VPERI and the second node of the fuse circuit 110 is supplied with a second voltage VBBSV during the read mode. The voltage VPERI is greater in potential than the voltage VBBSV. The constant voltage VSS is different from the voltage VBBSV. The first node is supplied with a voltage VPPSV and the second node is supplied with the voltage VBBSV during the programming mode.

<Second Embodiment>

Figure 6:
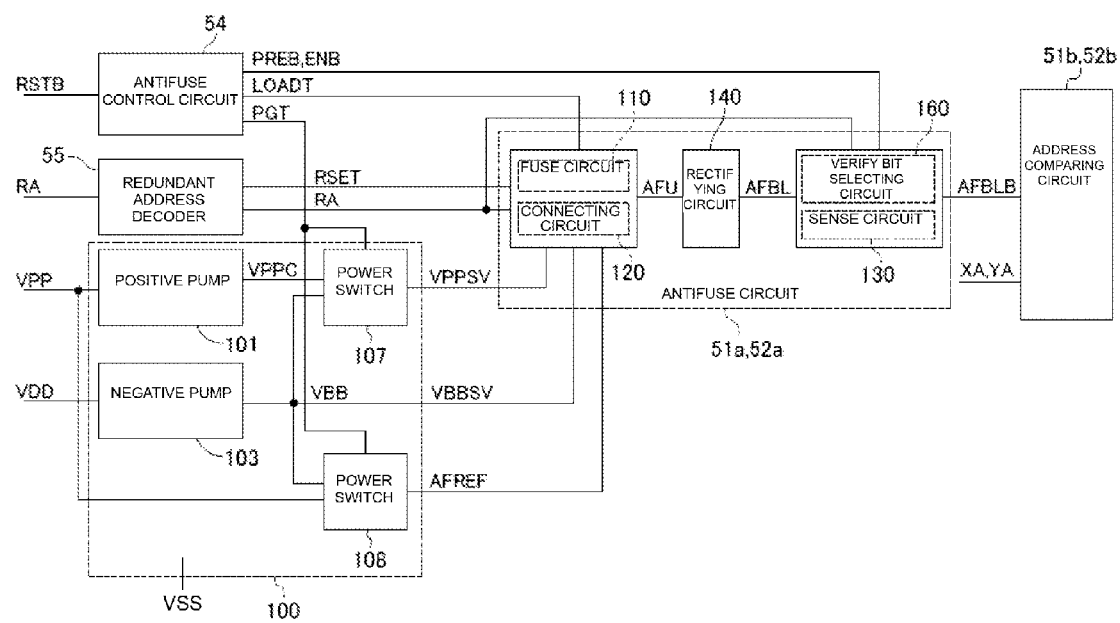
FIG. 6 is a block diagram for explaining a configuration of the antifuse circuits and the pump circuit according to a second embodiment.

FIG. 6 is a block diagram for explaining a configuration of the antifuse circuits 51a and 52a and the pump circuit 100 according to a second embodiment.

As shown in FIG. 6, according to this embodiment, the bias generating circuit 150 is eliminated and the negative pump 102 and reference voltage generating circuit 106 are eliminated from the pumping circuit 100. The power switches 104 and 105 are replaced with power switches 107 and 108. A verify bit selecting circuit 160 is added to the antifuse circuit 51a and to the antifuse circuit 52a.

In response to a program signal PGT, the power switch 107 selects the high voltage VPPC (6.0 V) or a negative voltage VBB (−1.0 V) on the power interconnect VBBSV, and outputs the selected voltage to the power interconnect VPPSV. In response to the program signal PGT, the power switch 108 selects the negative voltage VBB (−1.0 V) on the power interconnect VBBSV or the internal voltage VPP (3.0 V) and outputs the selected voltage as a connect signal AFREF. Other parts of the configuration of the antifuse circuits 51a and 52a and the pump circuit 100 are basically the same as the configuration of the antifuse circuits 51a and 52a and the pump circuit 100 of the first embodiment shown in FIG. 2. The same constituent elements as described in the first embodiment, therefore, are denoted by the same reference numerals and overlapping description is omitted.

Figure 7:
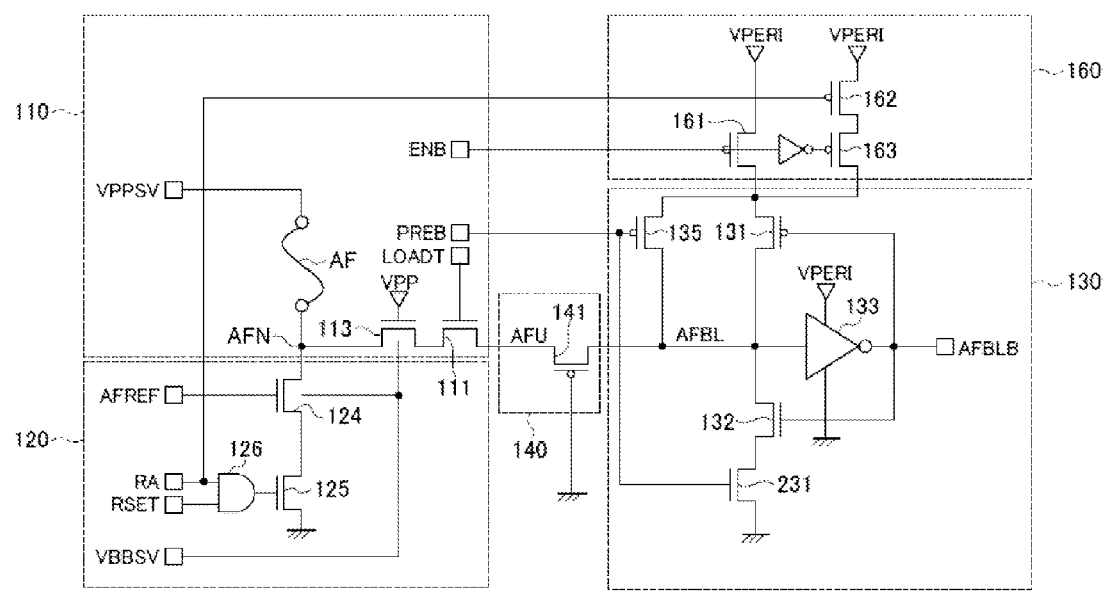
FIG. 7 is a circuit diagram of the loading circuit, the connecting circuit, the sensing circuit, the rectifying circuit, and a verifying bit selecting circuit according to a second embodiment.

FIG. 7 is a circuit diagram of the fuse circuit 110, the connecting circuit 120, the sense circuit 130, the rectifying circuit 140, and a verify bit selecting circuit 160 according to the second embodiment.

The rectifying circuit 140 of the second embodiment is connected between the MOS transistor 111 included in the fuse circuit 110 and the sensing node AFBL included in the sense circuit 130. The rectifying circuit 140 includes the transistor 141, which is, for example, a PMOS transistor having a source/drain path between the connection node AFU and the node AFBL, and a grounded gate electrode. Depending on an adopted circuit configuration, the transistor 141 may be provided as an NMOS transistor having a source/drain path between the connection node AFU and the node AFBL.

As shown in FIG. 7, the fuse circuit 110 of the second embodiment has the antifuse element AF connected between the power interconnect VPPSV and the connection node AFN, and N-channel-type MOS transistors 113 and 111 connected between the connection node AFN and the connection node AFU. The voltage at the gate electrode of the transistor 113 is fixed to the internal voltage VPP, and the substrate of the transistor 113 is connected to the power interconnect VBBSV.

The connecting circuit 120 of the second embodiment has N-channel-type MOS transistors 124 and 125 connected between the connection node AFN and an interconnect supplied with the ground voltage VSS. The gate electrode of the transistor 124 is supplied with a connect signal AFREF that is activated upon execution of the connecting operation. The gate electrode of the transistor 125 is supplied with the select signal RSET and with an output signal from a NAND gate circuit 126 that receives the corresponding bit of the redundant address RA.

The sense circuit 130 of the second embodiment has its bias transistor 134 replaced with a newly added N-channel-type enable transistor 231. The gate electrode of the enable transistor 231 is supplied with the pre-charge signal PREB. In such a configuration, a current control circuit composed of the transistors 132 and 231 is activated in a period during which the pre-charge signal PREB is at a high-voltage level.

The verify bit selecting circuit 160 is composed of a P-channel-type MOS transistor 161 connected between an interconnect supplied with the internal voltage VPERI and the sense circuit 130, and P-channel-type MOS transistors 162 and 163 also connected in series between the interconnect supplied with the internal voltage VPERI and the sense circuit 130. The gate electrode of the transistor 162 is supplied with the corresponding bit of the redundant address RA, while the gate electrodes of the transistors 161 and 163 are supplied with an enable signal ENB and a reverse signal created by reversing the enable signal ENB, respectively. In such a configuration, when the enable signal ENB is activated to a low-voltage level or when the enable signal ENB is deactivated to a high-voltage level and the corresponding bit of the redundant address RA is at a low-voltage level, the verify bit selecting circuit 160 supplies the internal voltage VPERI to the sense circuit 130.

Figure 8:
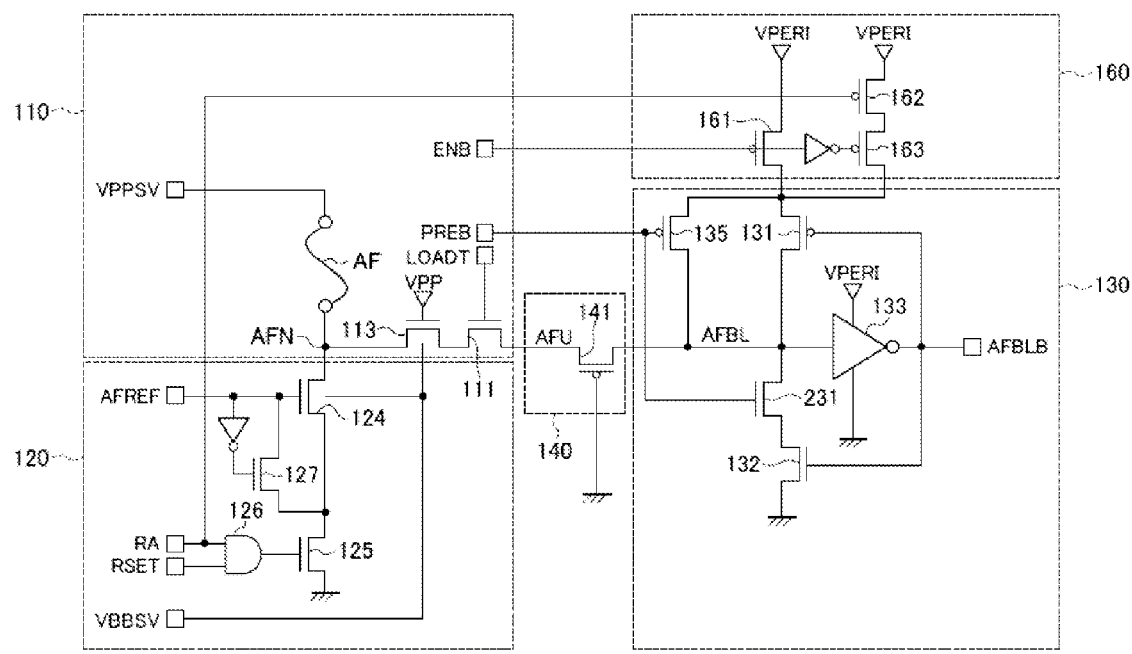
FIG. 8 is a circuit diagram of the loading circuit, the connecting circuit, the sensing circuit, the rectifying circuit, and the verifying bit selecting circuit configured as a modification of the second embodiment.

FIG. 8 is a circuit diagram of the fuse circuit 110, the connecting circuit 120, the sense circuit 130, the rectifying circuit 140, and the verify bit selecting circuit 160 configured as a modification of the second embodiment.

The modification of FIG. 8 is different from the circuit diagram of FIG. 7 in that an N-channel-type MOS transistor 127 is added to the connecting circuit 120 and that the order of connection of the transistors 132 and 231 included in the sense circuit 130 is reversed. Other parts of the configuration of the modification of FIG. 8 are the same as the configuration of the circuit diagram of FIG. 7. The same constituent elements as described in FIG. 7, therefore, are denoted by the same reference numerals and overlapping description is omitted.

The transistor 127 has a source connected to the source of the transistor 124, a drain supplied with the connect signal AFREF, and a gate electrode supplied with a reverse signal created by reversing the connect signal AFREF. In such a configuration, in a period during which the connect signal AFREF is deactivated, the voltage at the source of the transistor 124 is fixed to a low-voltage level (ground voltage VSS). The operation of the sense circuit 130 is the same as the operation of the sense circuit 130 of FIG. 7.

Figure 9:
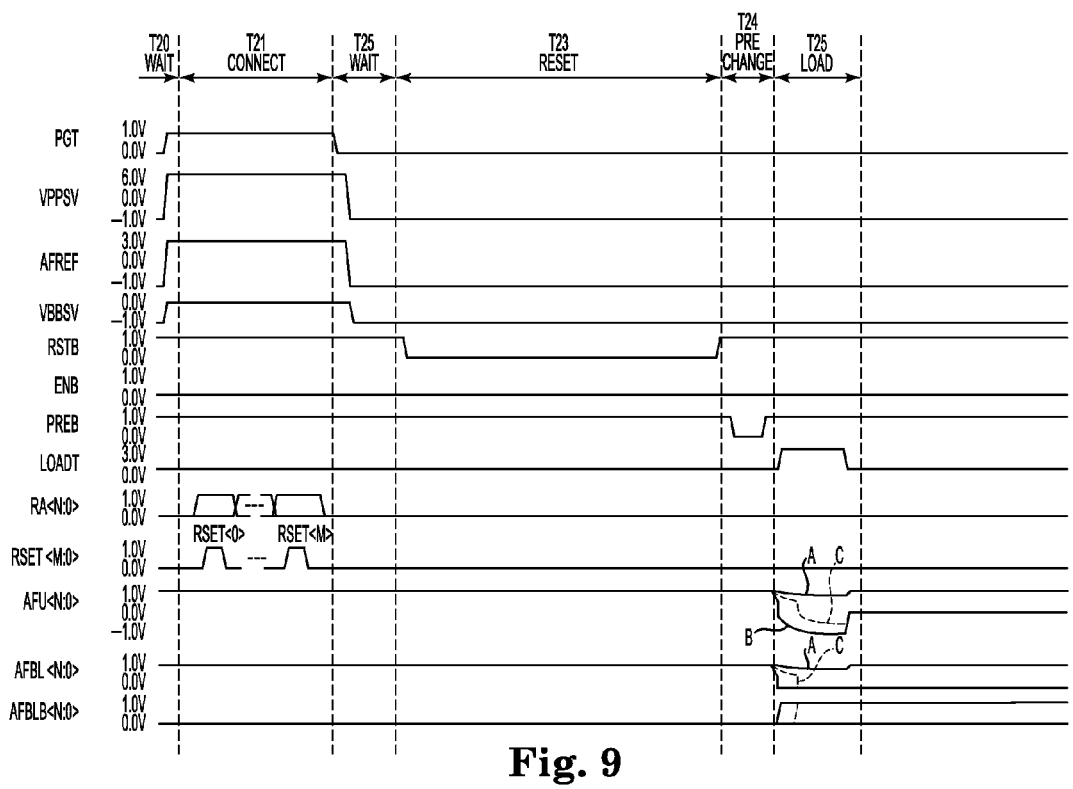
FIG. 9 is a timing chart for explaining an operation according to the second embodiment.

FIG. 9 is a timing chart for explaining an operation according to the second embodiment.

In a stand-by period T20, the program signal PGT is at a low-voltage level. Therefore, both power interconnects VPPSV and VBBSV are supplied with the negative voltage VBB (−1.0 V).

In a connect period T21, the program signal PGT shifts to a high-voltage level signal. As a result, the high voltage VPPC (6.0 V) is supplied to the power interconnect VPPSV and the ground voltage VSS (0 V) is supplied to the power interconnect VBBSV. The voltage level of the connect signal AFREF matches that of the internal voltage VPP (3.0 V). In this state, a series of select signals RSET go high in sequence, and each bit of the redundant address RA corresponds to each high-voltage level select signal RSET is input to the connecting circuit 120. In the example of FIG. 9, select signals RSET are of M+1 bits (RSET<0> to RSET <M>) and redundant addresses RA are of n+1 bits (RA<0> to RA<N>).

As a result, when the corresponding bit of the redundant address RA is high in voltage level, a connect voltage of about 6 V is applied across both ends of the antifuse element AF of FIG. 7 or 8, and this voltage application breaks the insulating film included in the antifuse element AF. This operation is repeated as select signals RSET to be activated are switched in sequence until all redundant addresses RA are programmed.

The above operation may be repeatedly executed on an antifuse element AF that is found not in properly connected state after execution of the verifying operation. The verifying operation is carried out by activating the sense circuit 130 with the enable signal ENB set low in voltage level.

In a stand-by period T22, a series of programming is completed.

Following the completion of the programming, information is read from the antifuse element AF every time the semiconductor device 10 is reset.

In a reset period T23, the reset signal RSTB is activated to a low-voltage level. In a pre-charge period T24 to follow, the pre-charge signal PREB is activated to a low-voltage level. As a result, the sense node AFBL in the sense circuit 130 is pre-charged to the voltage level of the internal voltage VPERI (1.0 V).

In a load period T25, the pre-charging is canceled and the load signal LOADT is activated to a high-voltage level. As a result, the sense node AFBL is connected to the power interconnect VPPSV via the rectifying circuit 140 and the antifuse element AF. As a result, a sense current flows through the antifuse element AF, and the voltage at the sense node AFBL changes according to the magnitude of the sense current. At this time, in the same manner as in the first embodiment, a voltage of about 2 V is applied across both ends of the antifuse element AF.

When the antifuse element AF is not put in connected state (i.e., kept in its insulated state), the sense current hardly flows through the antifuse element AF. The voltage at the connection node AFU, therefore, is kept at the pre-charged voltage level, as indicated by reference numeral A. When the antifuse element AF is put in connected state (i.e., put in conductive state), the sense current flows through the antifuse element AF. The voltage at the connection node AFU, therefore, drops significantly, as indicated by reference numeral B.

When the antifuse element AF is put in semi-connected state, little sense current flows through the antifuse element AF. As a result, the voltage at the connection node AFU drops mildly, as indicated by reference numeral C. However, because the voltage of about 2 V is applied across both ends of the antifuse element AF during the loading operation, the sensing operation with higher sensitivity can be carried out in this embodiment.

When the antifuse element AF is put in connected state and its resistance is sufficiently low, the voltage at the connection node AFU drops to a voltage close to −1.0 V, as indicated by reference numeral B. In this embodiment, however, because the rectifying circuit 140 is interposed between the sense node AFBL and the connection node AFU, the voltage at the sense node AFBL never drops below the ground voltage VSS. This means that current backflow from the interconnect (source of the transistor 132) supplied with the ground voltage VSS to the power interconnect VPPSV never occurs.

<Third Embodiment>

Figure 10:
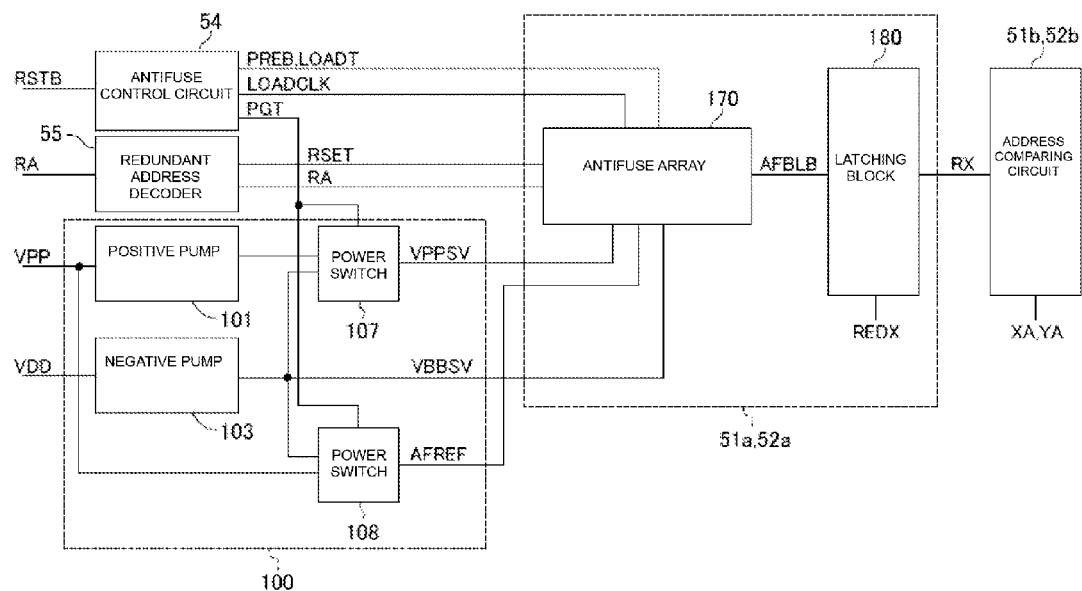
FIG. 10 is a block diagram for explaining a configuration of the antifuse circuits and the pump circuit according to a third embodiment.

FIG. 10 is a block diagram for explaining a configuration of the antifuse circuits 51a and 52a and the pump circuit 100 according to a third embodiment.

As shown in FIG. 10, according to this embodiment, each of the antifuse circuits 51a and 52a is composed of an antifuse array 170 and a latching block 180. Other parts of the configuration of the block diagram of FIG. 10 are basically the same as the configuration of the block diagram of FIG. 6 of the second embodiment. The same constituent elements as described in the second embodiment, therefore, are denoted by the same reference numerals and overlapping description is omitted.

Figure 11:
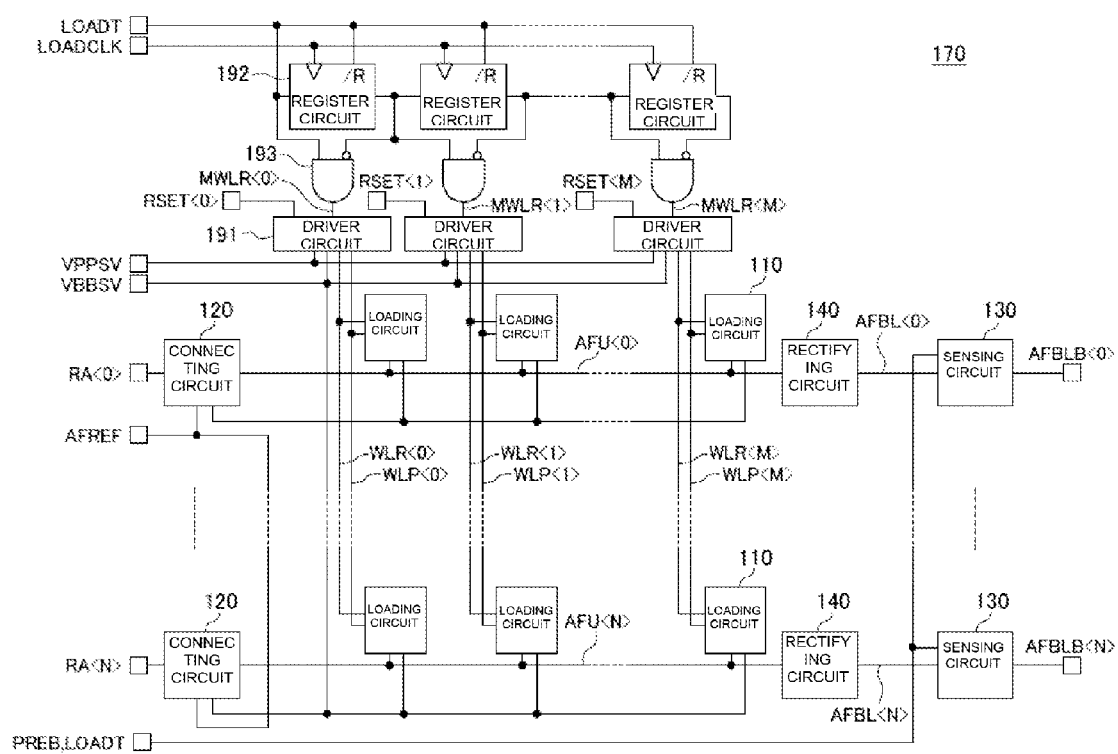
FIG. 11 is a circuit diagram of an antifuse array.

FIG. 11 is a circuit diagram of the antifuse array 170.

As shown in FIG. 11, the antifuse array 170 has an array of multiple loading circuits 110. In the example of FIG. 11, the loading circuits 110 are arrayed into an N+1×M+1 matrix, in which each row corresponds to respective bits of redundant addresses RA and each column corresponds to one redundant address RA.

The antifuse array 170 has multiple connecting circuits 120, sensing circuits 130, and rectifying circuits 140 that are assigned to rows of loading circuits 110 such that each set of the connecting circuit 120, sense circuit 130, and rectifying circuit 140 corresponds to each row of loading circuits 110, and driver circuits 191 assigned to columns of loading circuits 110 such that each driver circuit 191 corresponds to each column of loading circuits 110.

The rectifying circuits 140 are connected between the corresponding connection nodes AFU and the corresponding sensing nodes AFBL, respectively. For example, a rectifying circuit 140<0> is connected between a connection node AFU<0> and a sensing node AFBL<0>. A configuration of the rectifying circuit 140 will be described in detail, referring to FIG. 16.

Each row of loading circuits 110 included in the multiple loading circuits 110 are connected to each common connection node AFU. Hence each row of loading circuits 110 are all connected to the corresponding sense circuit 130 via the corresponding rectifying circuit 140. In FIG. 11, N+1 connection nodes AFU are denoted as AFU<0> to AFU<N>.

Each driver circuit 191 selects any one of columns of loading circuits 110 included in the multiple loading circuits 110. Each driver circuit 191 generates each program signal WLP and each read signal WLR, based on each corresponding select signal RSET and main word signal MWLP, and supplies the generated signals to all of each column of loading circuits 110. In FIG. 11, M+1 select signals RSET are denoted as RSET<0> to RSET <M>, and M+1 main word signals MWLR are denoted as MWLR<0> to MWLR<M>.

The main word signal MWLR is generated by an AND gate circuit 193 that receives the load signal LOADT and an output signal from the corresponding register circuit 192. Each register circuit 192 is provided for each column of loading circuits 110 corresponding to the register circuit 192. Hence the register circuits 192 are cascaded to the columns of loading circuits 110 to serve as a shift register, as shown in FIG. 11. The clock node of the register circuit 192 is supplied with a load clock signal LOADCLK. As a result, latched data sequentially shifts in synchronization with the clocking of the load clock signal LOADCLK. The register circuit 192 is reset when the load signal LOADT is deactivated to a low-voltage level.

Figure 12:
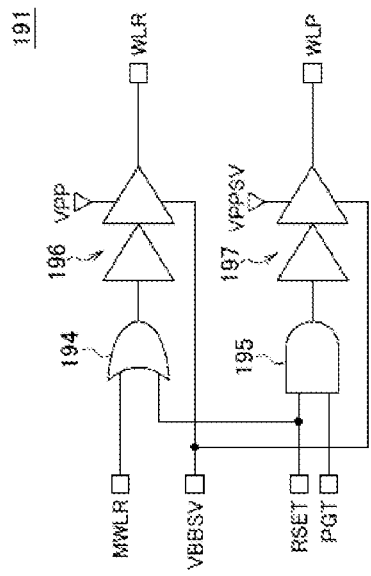
FIG. 12 is a circuit diagram of a driver circuit.

FIG. 12 is a circuit diagram of the driver circuit 191.

As shown in FIG. 12, the driver circuit 191 has an OR gate circuit 194 that receives the main word signal MWLR and the select signal RSET, and an AND gate circuit 195 that receives the select signal RSET and the program signal PGT.

An output signal from the OR gate circuit 194 is transmitted through a buffer circuit 196 and output as the read signal WLR. Because the buffer circuit 196 is supplied with the internal voltage VPP (3.0 V) working as an operating voltage and with a voltage at the power interconnect VBBS, the voltage level of the read signal WLR matches that of the internal voltage VPP (3.0 V).

An output signal from the AND gate circuit 195 is transmitted through a buffer circuit 197 and output as the program signal WLP. Because the buffer circuit 197 is connected to the power interconnects VPPSV and VBBSV, the voltage level of the program signal WLP upon execution of the connecting operation matches that of the high voltage VPPS (6.0 V) at the power interconnect VPPSV, and the voltage level of the program signal WLP upon execution of the loading operation matches that of the negative voltage VBB (−1.0 V) at the power interconnect VBBSV.

Figure 13:
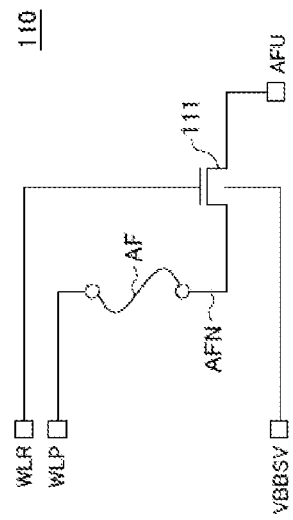
FIG. 13 is a circuit diagram of the loading circuit according to the third embodiment.

FIG. 13 is a circuit diagram of the fuse circuit 110 according to the third embodiment.

As shown in FIG. 13, the fuse circuit 110 of the third embodiment is composed of the antifuse element AF and the transistor 111 connected in series to each other. One end of the antifuse element AF is supplied with the program signal WLP, and the gate electrode of the transistor 11 is supplied with the read signal WLR. The substrate of the transistor 111 is connected to the power interconnect VBBSV.

The drain of the transistor 111 is connected to the connection node AFU. As shown in FIG. 11, the connection node AFU is the common node connected to a row of loading circuits 110.

Figure 14:
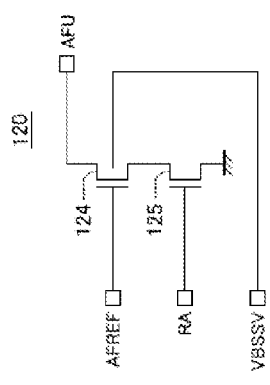
FIG. 14 is a circuit diagram of the connecting circuit according to the third embodiment.

FIG. 14 is a circuit diagram of the connecting circuit 120 according to the third embodiment.

As shown in FIG. 14, the connecting circuit 120 of the third embodiment is composed of transistors 124 and 125 connected in series between the connection node AFU and the interconnect supplied with the ground voltage VSS. The gate electrode of the transistor 124 is supplied with the connect signal AFREF, while the gate electrode of the transistor 125 is supplied with the corresponding bit of the redundant address RA. The substrate of the transistor 124 is connected to the power interconnect VBBSV. This prevents application of a high voltage to the transistor 125.

Figure 15:
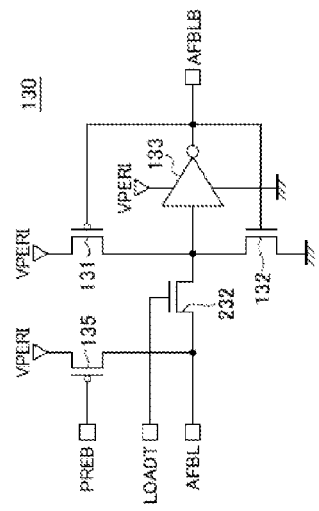
FIG. 15 is a circuit diagram of the sensing circuit according to the third embodiment.

FIG. 15 is a circuit diagram of the sense circuit 130 according to the third embodiment.

As shown in FIG. 15, the sense circuit 130 of the third embodiment is different from the sense circuit 130 of FIG. 3 in that sense circuit 130 of the third embodiment has no bias transistor 134 but has a newly added N-channel-type MOS transistor 232. Other parts of the configuration of the sense circuit 130 of the third embodiment are the same as the configuration of the sense circuit 130 of FIG. 3. The same constituent elements as described in FIG. 3 are denoted by the same reference numerals and overlapping description are omitted.

The transistor 232 is placed between the sensing node AFBL and the input node of the inverter circuit 133, and has a gate electrode supplied with the load signal LOADT. Because of this configuration, activation of the load signal LOADT to a high-voltage level results in short circuit between the sensing node AFBL and the input node of the inverter circuit 133.

Figure 16:
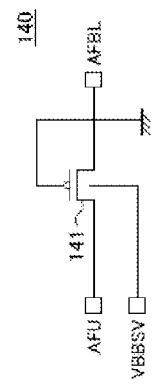
FIG. 16 is a circuit diagram of the rectifying circuit according to the third embodiment.

FIG. 16 is a circuit diagram of the rectifying circuit 140 according to the third embodiment.

As shown in FIG. 16, the rectifying circuit 140 of the third embodiment is composed of the transistor 141 connected between the connection node AFU and the sensing node AFBL, which means that the rectifying circuit 140 of the third embodiment is identical in circuit configuration with the rectifying circuit 140 of FIG. 3. The voltage at the gate electrode of the transistor 141 is fixed to the ground voltage VSS, and the substrate of the transistor 141 is connected to the power interconnect VBBSV.

What is described above is the circuit configuration of the antifuse array 170. When programming on the antifuse array 170 having such a configuration is carried out, any one column of loading circuits is selected, using the driver circuit 191, and then a high voltage is applied across both ends of one or two or more antifuse elements AF, using multiple connect circuits 120. Through this process, the programming is carried out on a column by column basis. When information is read from the antifuse array 170, any one column of loading circuits is selected, using the driver circuit 191, and then the load signal LOADT is activated to cause a sense current to flow through multiple antifuse elements AF. Through this process, the loading operation is carried out on a column by column basis.

Faulty address information AFBLB read by the loading operation is supplied to the latching block 180 of FIG. 10.

Figure 17:
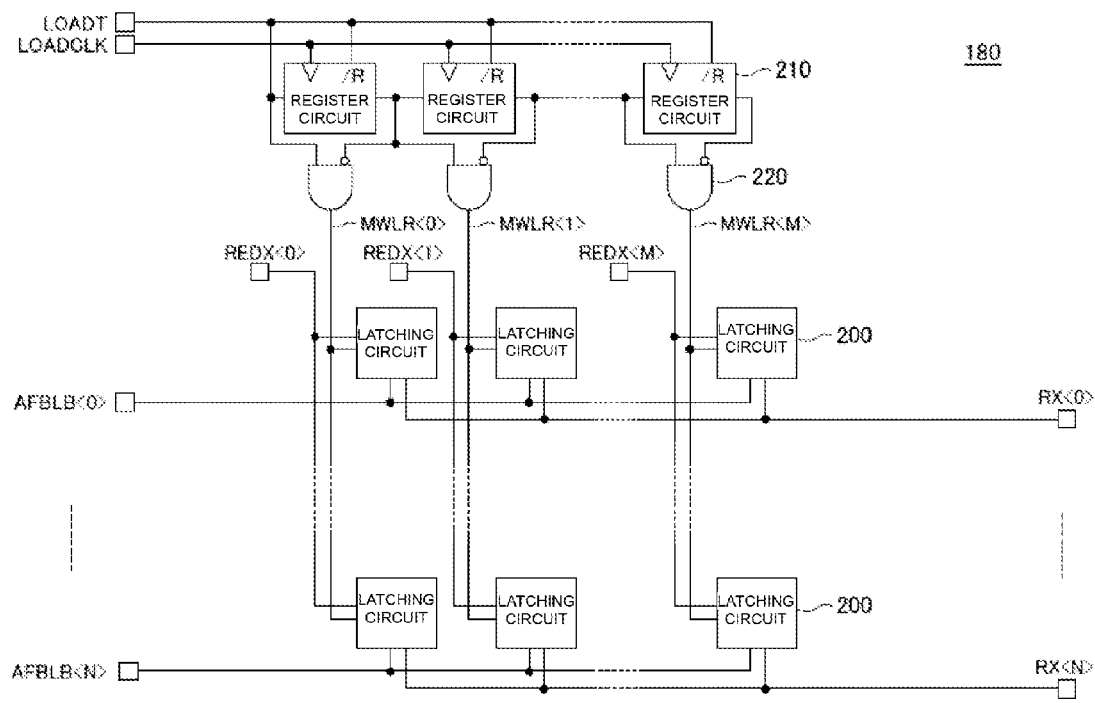
FIG. 17 is a circuit diagram of a latching block.

FIG. 17 is a circuit diagram of the latching block 180.

As shown in FIG. 17, the latching block 180 has an array of multiple latching circuits 200. In the example of FIG. 17, the latching circuits 200 are arrayed into an N+1×M+1 matrix, in which each row corresponds to respective bits of redundant addresses RA and each column corresponds to one redundant address RA.

Each row of latching circuits 200 included in the multiple latching circuits 200 is supplied with the corresponding bit of the faulty address information AFBLB as a common input bit. In FIG. 17, the faulty address information AFBLB of N+1 bits is denoted as AFBLB<0> to AFBLB<N>.

Each column of latching circuits 200 included in the multiple latching circuits 200 is selected through each main word signal MWLR. The circuit that generates the main word signal MWLR has been described above.

Figure 18:
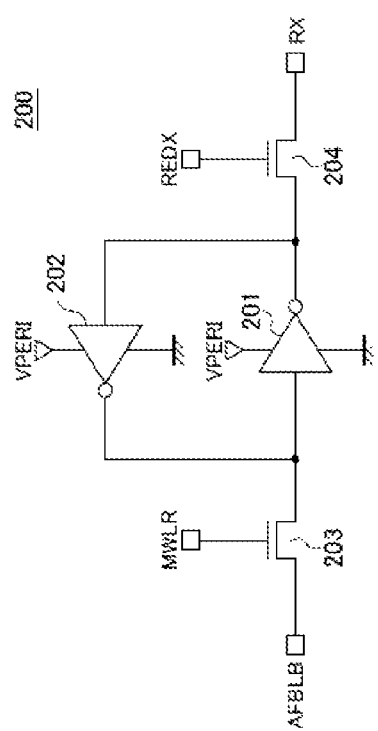
FIG. 18 is a circuit diagram of a latching circuit.

FIG. 18 is a circuit diagram of the latching circuit 200.

As shown in FIG. 18, the latching circuit 200 has two connected inverters 201 and 202, a transistor 203 for inputting the corresponding bit of the faulty address information AFBLB, and a transistor 204 that outputs latched information.

The gate electrode of the transistor 203 is supplied with the corresponding main word signal MWLR. In this configuration, each bit of the faulty address information AFBLB read from the antifuse array 170 is transferred to the corresponding latching circuit 200.

The gate electrode of the transistor 204 is supplied with an output signal REDX. The transistor 204 is connected between the inverters 201 and 202 and an output line RX. In this configuration, when the output signal REDX is activated, information latched by the latching circuit 200 is output to the output line RX. As shown in FIG. 17, each row of latching circuits 200 is connected to each common output line RX. In FIG. 17, N+1 output lines RX are denoted as RX<0> to RX<N>, and output signals REDX of M+1 bits are denoted as REDX<0> to REDX<M>.

In this configuration, when the loading operation is carried out on the antifuse array 170, pieces of faulty address information AFBLB read from the array of loading circuits 110 are transferred in sequence to the array of latching circuits 200. Faulty address information AFBLB transferred to the latching circuit 200 is supplied to the address comparing circuits 51*b* and 52*b* via the output line RX.

An operation according to the third embodiment will then be described.

Figure 19:
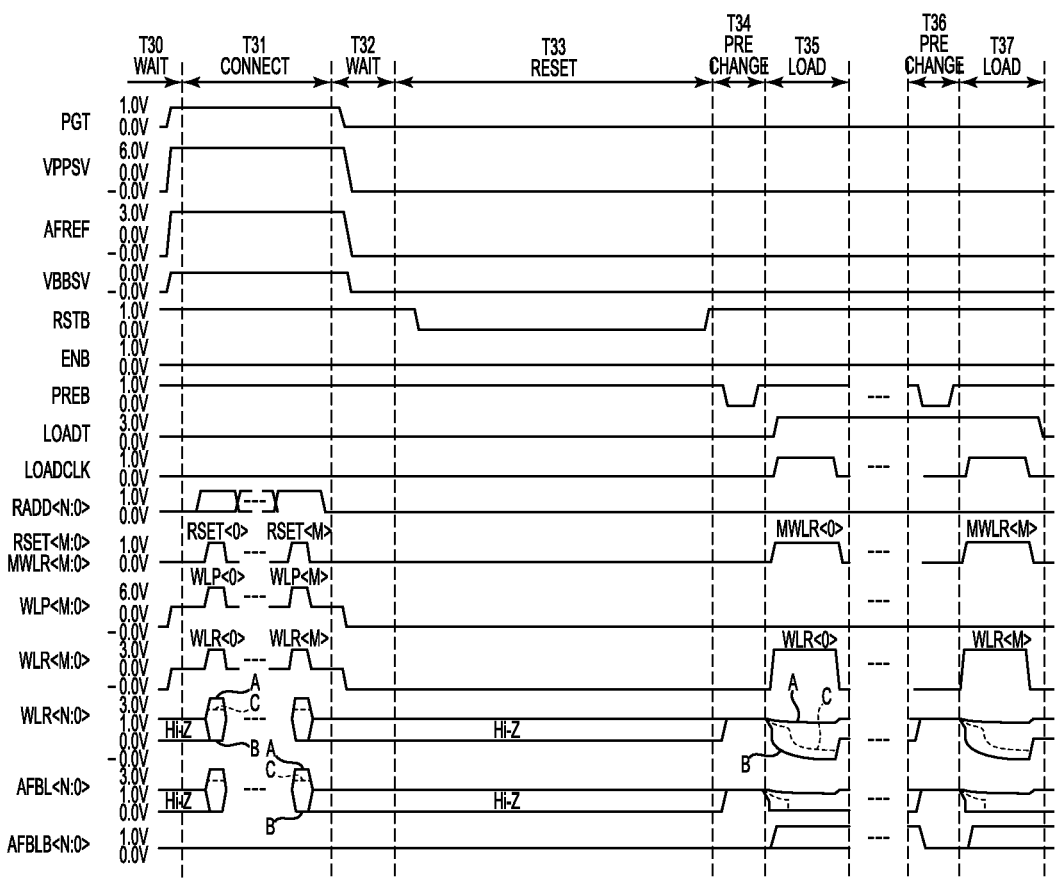
FIG. 19 is a timing chart for explaining an operation according to the third embodiment.

FIG. 19 is a timing chart for explaining the operation according to the third embodiment.

In a stand-by period T30, the program signal PGT is at a low-voltage level. The negative voltage VBB (−1.0 V), therefore, is supplied to the power interconnects VPPSV and VBBSV.

In a connect period T31, the program signal PGT shifts to a high-voltage level signal. As a result, the high voltage VPPC (6.0 V) is supplied to the power interconnect VPPSV and the ground voltage VSS (0 V) is supplied to the power interconnect VBBSV. The voltage level of the connect signal AFREF matches that of the internal voltage VPP (3.0 V). In a state where a given main word signal MWLR is activated, a series of select signals RSET go high in sequence, and each bit of the redundant address RA corresponds to each high-voltage level select signal RSET is input to each of multiple connecting circuits 120. As a result, the redundant address RA is programmed into a selected column of multiple loading circuits 110.

Such an operation is carried out on every row of loading circuits 110 by switching the main word signal MWLR to be selected. Hence each redundant address RA corresponding to each column of the antifuse array 170 is programmed into each column of loading circuits 110. This operation may be repeatedly executed on an antifuse element AF that is found to be not in properly connected state after execution of the verifying operation.

Following the completion of the programming, information is read from the antifuse element AF every time the semiconductor device 10 is reset.

In a reset period T33, the reset signal RSTB is activated to a low-voltage level.

In a pre-charge period T34, the pre-charge signal PREB is activated to a low-voltage level. As a result, the sense node AFBL in every sense circuit 130 is pre-charged to the voltage level of the internal voltage VPERI (1.0 V).

In a load period T35, the pre-charging is canceled and the load signal LOADT is activated to a high-voltage level. As a result, the sense node AFBL is connected to the power interconnect VPPSV via the rectifying circuit 140 and the antifuse element AF. As a result, a sense current flows through the antifuse element AF, and the voltage at the sense node AFBL changes according to the magnitude of the sense current. At this time, in the same manner as in the first and second embodiments, a voltage of about 2 V is applied across both ends of the antifuse element AF.

When the antifuse element AF is not put in connected state (i.e., kept in its insulated state), the sense current hardly flows through the antifuse element AF. The voltage at the connection node AFU, therefore, is kept at the pre-charged voltage level, as indicated by reference numeral A. When the antifuse element AF is put in connected state (i.e., put in conductive state), the sense current flows through the antifuse element AF. The voltage at the connection node AFU, therefore, drops significantly, as indicated by reference numeral B.

When the antifuse element AF is put in semi-connected state, little sense current flows through the antifuse element AF. As a result, the voltage at the connection node AFU drops mildly, as indicated by reference numeral C. However, because the voltage of about 2 V is applied across both ends of the antifuse element AF during the loading operation, the sensing operation with higher sensitivity can be carried out in this embodiment.

When the antifuse element AF is put in connected state and its resistance is sufficiently low, the voltage at the connection node AFU drops to a voltage close to −1.0 V. In this embodiment, however, because the rectifying circuit 140 is interposed between the sense node AFBL and the connection node AFU, the voltage at the sense node AFBL never drops below the ground voltage VSS. This means that current backflow from the interconnect (source of the transistor 132) supplied with the ground voltage VSS to the power interconnect VPPSV never occurs.

The faulty address information AFBLB read in this manner is written to a given latching circuit 200 included in the latching block 180. When the above operation is executed in sequence on each of rows of loading circuits, pieces of faulty address information AFBLB loaded onto rows of loading circuits are transferred in sequence to the latching block 180. In the example of FIG. 19, all transfer actions are completed in a period consisting of a pre-charge period T36 and a load period T37 when loading operations are repeated M+1 times.

The above described third embodiment in which the loading circuits 110 including the antifuse elements AF are arranged into the matrix array offers the same effect as the first and second embodiments offer.

It is apparent that the present invention is not limited to the above embodiments, but may be modified and changed without departing from the scope and spirit if the invention.

For example, the above embodiments are described as the case where the configurations of the rectifying circuit 140 and circuits related thereto are applied to the operations involving the antifuse element. However, the rectifying circuit 140 and related circuits may be applied to operations involving a non-volatile memory element, such as fuse circuit and fuse element.

For example, the above embodiments are described as the case where the present invention is applied to the DRAM (Dynamic Random Access Memory). However, the present invention is applied not only to the DRAM but also to other types of semiconductor memory devices, such as a PCM (Phase Change Memory), ReRAM (Resistive Random Access Memory), MRAM (Magnetic Random Access Memory), STT-RAM (Spin Transfer Torque Memory), and flash memory, or to logic-processing semiconductor devices, such as a CPU and DSP.

What is claimed is:

1. An apparatus comprising:
 a fuse circuit including a fuse element, the fuse circuit configured to provide a first output signal having a first voltage or a second voltage responsive to a state of the fuse element; and
 a sense circuit configured to provide a second output signal having the first voltage or a third voltage responsive to the first output signal, the third voltage different from the second voltage,
 wherein a difference in voltage between the first and third voltages is less than a difference in voltage between the first and second voltages.

2. An apparatus comprising:
 a fuse circuit including a fuse element, the fuse circuit configured to provide a first output signal having a first voltage, or a second voltage responsive to a state of the fuse element; and
 a sense circuit configured to provide a second output signal having the first voltage or a third voltage responsive to the first output signal, the third voltage different from the second voltage, wherein the second voltage is greater in absolute value than the third voltage.

3. The apparatus of claim 2, wherein the first voltage is greater in potential than each of the second and third voltages.

4. An apparatus comprising:
a fuse circuit including a fuse element the fuse circuit configured to provide a first output signal having a first voltage or a second voltage responsive to a state of the fuse element; and
a sense circuit configured to provide a second output signal having the first voltage or a third voltage responsive to the first output signal, the third voltage different from the second voltage,
wherein the fuse circuit is configured to be supplied with the first voltage during a first period of time and change its voltage to the second voltage responsive to the state of the fuse element during, a second period of time following the first period of time, and
wherein the fuse circuit is configured to change its voltage to the second voltage during the second period of time on condition that the fuse element is programmed.

5. The apparatus of claim 4, wherein the fuse circuit is configured to maintain its voltage at the first voltage during the second period of time on condition that the fuse element not programmed.

6. An apparatus comprising:
a fuse circuit including a fuse element, the fuse circuit configured to provide a first output signal having a first voltage or a second voltage responsive to a state of the fuse element;
a sense circuit configured to provide a second output signal having the first voltage or a third voltage responsive to the first output signal the third voltage different from the second voltage; and
a P conductivity type transistor comprising a gate supplied with the third voltage and a channel between the sense circuit and the fuse circuit.

7. An apparatus comprising:
a fuse circuit including a fuse element, the fuse circuit configured to provide a first output signal having a first voltage or a second voltage responsive to a state of the fuse element;
a sense circuit configured to provide a second output signal having the first voltage or a third voltage responsive to the first out signa1, the third voltage different from the second voltage; and
an N conductivity type transistor comprising a gate supplied with the third voltage and a channel between the sense circuit and the fuse circuit.

8. An apparatus comprising:
a pumping circuit configured to be supplied with a first voltage and a second voltage and perform a pumping operation based on the first voltage and the second voltage to generate a third voltage at an output node;
a sense circuit; and
an electrical fuse including a first node coupled to the output node of the pumping circuit and a second node coupled to the sense circuit;
wherein the pumping circuit is further configured to supply the third voltage to the first node of the electrical fuse when the sense circuit amplifies a voltage at the second node of the electrical fuse.

9. The apparatus of claim 8, wherein the third voltage is a negative voltage.

10. The apparatus of claim 8, further comprising:
an additional pumping circuit configured to be supplied with the first voltage and the second voltage and perform an additional pumping operation based on the first voltage and the second voltage to generate a fourth voltage at an additional output node; and
a connecting circuit coupled between the additional output node and the second node of the electrical fuse, the connecting circuit configured to supply the fourth voltage to the second node of the electrical fuse when the connecting circuit is enabled.

11. The apparatus of claim 10, wherein the additional pumping circuit is configured to stop the additional pumping operation when the sense circuit amplifies the voltage at the second node of the electrical fuse.

12. The apparatus of claim 8, further comprising a P conductivity type transistor coupled between the sense circuit and the second node of the electrical fuse, the P conductivity type transistor having a gate supplied with the second voltage.

13. The apparatus of claim 8, further comprising an N conductivity type transistor coupled between the sense circuit and the second node of the electrical fuse, the N conductivity type transistor having a gate supplied with the second voltage.

14. An apparatus comprising:
a fuse circuit including a fuse element;
a sense circuit;
a first transistor coupled between a first node of the fuse circuit and an input node of the sense circuit, the first transistor having a gate supplied with a constant voltage; and
a second transistor coupled in series to the first transistor between the first node of the fuse circuit and the input node of the sense circuit, wherein the second transistor is configured to turn on during a first mode and turn off during a second mode.

15. The apparatus of claim 14, wherein the fuse circuit further includes a second node, the first node is supplied with a first voltage and the second node is supplied with a second voltage during the first mode, the first voltage is greater in potential than the second voltage.

16. The apparatus of claim 15, wherein the constant voltage is different from the second voltage.

17. The apparatus of claim 16, wherein the first node is supplied with a third voltage and the second node is supplied with the second voltage during the second mode.

* * * * *